US012028963B2

(12) United States Patent
Gottwald

(10) Patent No.: US 12,028,963 B2
(45) Date of Patent: Jul. 2, 2024

(54) PRINTED CIRCUIT BOARD MODULE, PRINTED CIRCUIT BOARD ELEMENT, HEATSINK, HEAT-CONDUCTING ELEMENT AND METHOD OF PRODUCING A THERMALLY CONDUCTIVE LAYER

(71) Applicant: Schweizer Electronic AG, Schramberg (DE)

(72) Inventor: Thomas Gottwald, Dunningen (DE)

(73) Assignee: SCHWEIZER ELECTRONIC AG, Schramberg (DE)

(*) Notice: Subject to any disclaimer, the term of this patent is extended or adjusted under 35 U.S.C. 154(b) by 20 days.

(21) Appl. No.: 17/541,440

(22) Filed: Dec. 3, 2021

(65) Prior Publication Data

US 2022/0183138 A1 Jun. 9, 2022

(30) Foreign Application Priority Data

Dec. 9, 2020 (DE) .......................... 102020132808.7

(51) Int. Cl.
*H05K 1/02* (2006.01)
(52) U.S. Cl.
CPC ....... *H05K 1/021* (2013.01); *H05K 2201/066* (2013.01)
(58) Field of Classification Search
CPC ............. H05K 7/2039; H05K 7/20454; H05K 7/20463; H05K 7/20472; H05K 7/205; H05K 7/2089–209; H05K 1/0201–0212; H05K 1/021; H05K 1/029; H05K 1/032; H05K 1/185; H05K 2201/06–068; H05K 2201/10416; H01L 23/00; H01L 23/373; H01L 23/367; H01L 23/3733;
(Continued)

(56) References Cited

U.S. PATENT DOCUMENTS 5,870,285 A * 2/1999 Kosteva .............. H01L 23/4093
174/16.3
7,718,246 B2 * 5/2010 Strauss ................. B22F 3/1125
428/318.6
(Continued)

FOREIGN PATENT DOCUMENTS

CN 108990254 A * 12/2018 ......... H01L 23/3677
CN 112992759 A * 6/2021 ....... H01L 21/67144
(Continued)

OTHER PUBLICATIONS

CN-108990254-A English Translation (Year: 2018).*
(Continued)

*Primary Examiner* — Amir A Jalali
(74) *Attorney, Agent, or Firm* — FRESH IP PLC

(57) ABSTRACT

Printed circuit board module (30) having a printed circuit board (50) and a heatsink (40), and, provided between the printed circuit board (50) and the heatsink (40), a two-dimensional heat-conducting element (10) comprising a ceramic carrier (12) coated with a phase change material (14, 16). In the printed circuit board (50) or the heatsink (40), a through-bore (59) may be provided to accommodate a screw (80) and one end of the screw (86) may mesh into a receiving hole (49) which preferably has a mating thread and is formed in the heatsink (40) or the printed circuit board (50), wherein a screw head (84) of the screw (80) especially has a sprung washer element (90) beneath it.

3 Claims, 11 Drawing Sheets

(58) Field of Classification Search
CPC . H01L 23/3735; H01L 23/3736; H01L 23/42; H01L 24/16; H01L 24/32; H01L 24/73
See application file for complete search history.

(56) References Cited

U.S. PATENT DOCUMENTS

| | | | |
|---|---|---|---|
| 10,867,883 B2* | 12/2020 | Soupremanien | H01L 23/427 |
| 2005/0027055 A1 | 2/2005 | Dani | |
| 2005/0117305 A1* | 6/2005 | Ulen | H01L 23/4006 |
| | | | 257/E23.084 |
| 2005/0228097 A1 | 10/2005 | Zhong | |
| 2013/0189049 A1* | 7/2013 | Stotz, Jr. | F16B 5/0266 |
| | | | 411/111 |
| 2013/0329370 A1 | 12/2013 | Gottwald | |
| 2015/0319886 A1* | 11/2015 | Albrecht, III | H05K 1/144 |
| | | | 361/709 |
| 2016/0014901 A1 | 1/2016 | Gottwald | |
| 2017/0090532 A1* | 3/2017 | Koukami | G06F 1/203 |
| 2017/0196075 A1* | 7/2017 | Barron | H05K 5/0008 |
| 2021/0111098 A1* | 4/2021 | Joshi | H05K 7/20445 |

FOREIGN PATENT DOCUMENTS

| | | | | |
|---|---|---|---|---|
| EP | 2 524 394 B1 | 11/2011 | | |
| EP | 2 973 687 B1 | 11/2014 | | |
| JP | 2000511466 A | * 5/1997 | | |
| JP | 3849381 B2 | * 11/2006 | | H05K 1/0257 |
| JP | 2009170758 A | * 7/2009 | | |
| JP | 6299066 B2 | * 3/2018 | | |
| JP | 2022003010 A | * 1/2022 | | C04B 37/02 |
| WO | WO 2020/064350 | 4/2020 | | |

OTHER PUBLICATIONS

CN-112992759-A English Translation (Year: 2021).*
JP-2009170758-A English Translation (Year: 2009).*
JP3849381B2 English Translation (Year: 2006).*
JP-2000511466-A English Translation (Year: 1997).*
JP-2022003010-A English Translation (Year: 2022).*
JP-6299066-B2 English Translation (Year: 2018).*
Deutsches Patent -und Markenamt Examination Report dated Nov. 16, 2021.

* cited by examiner

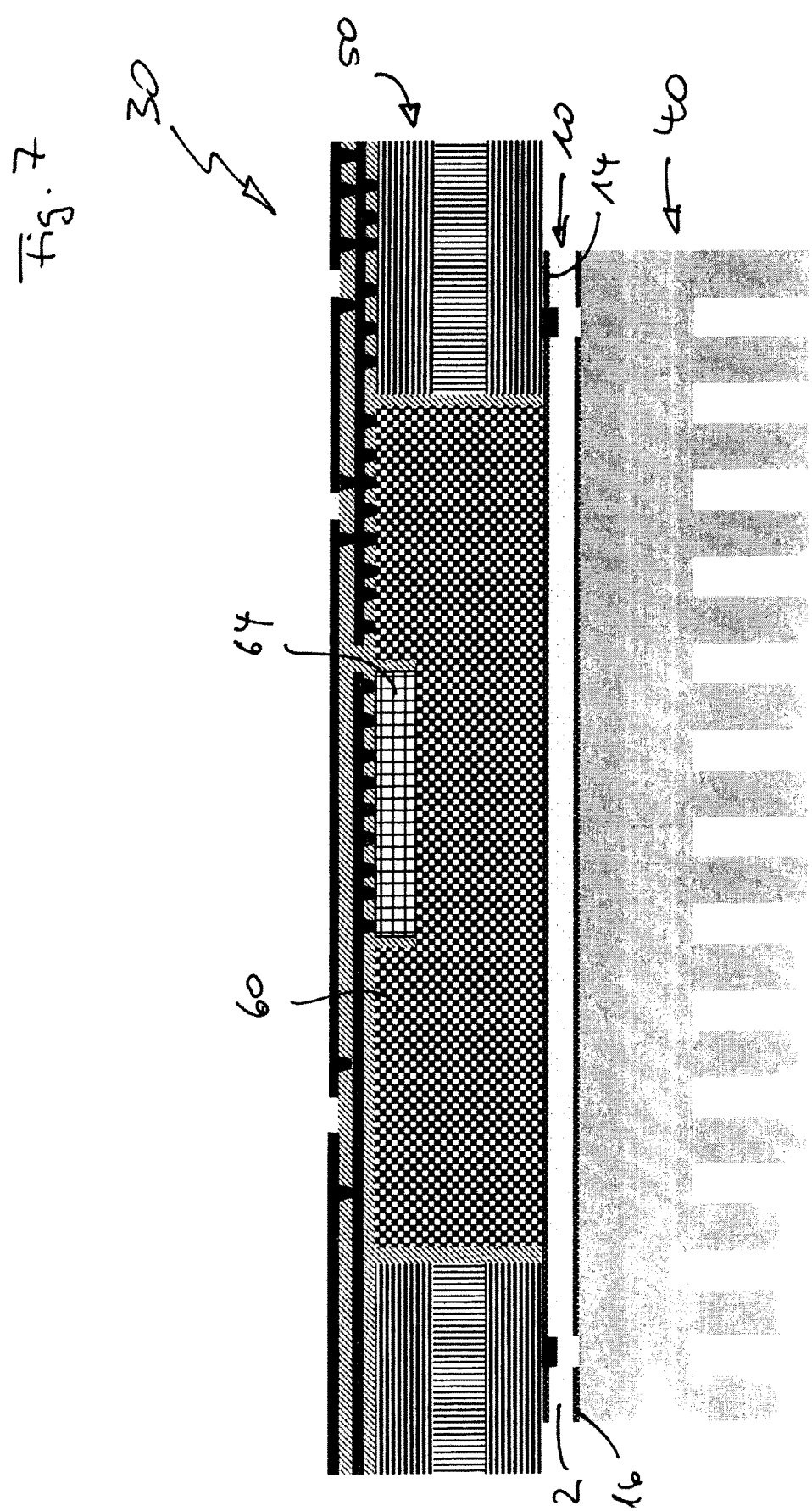

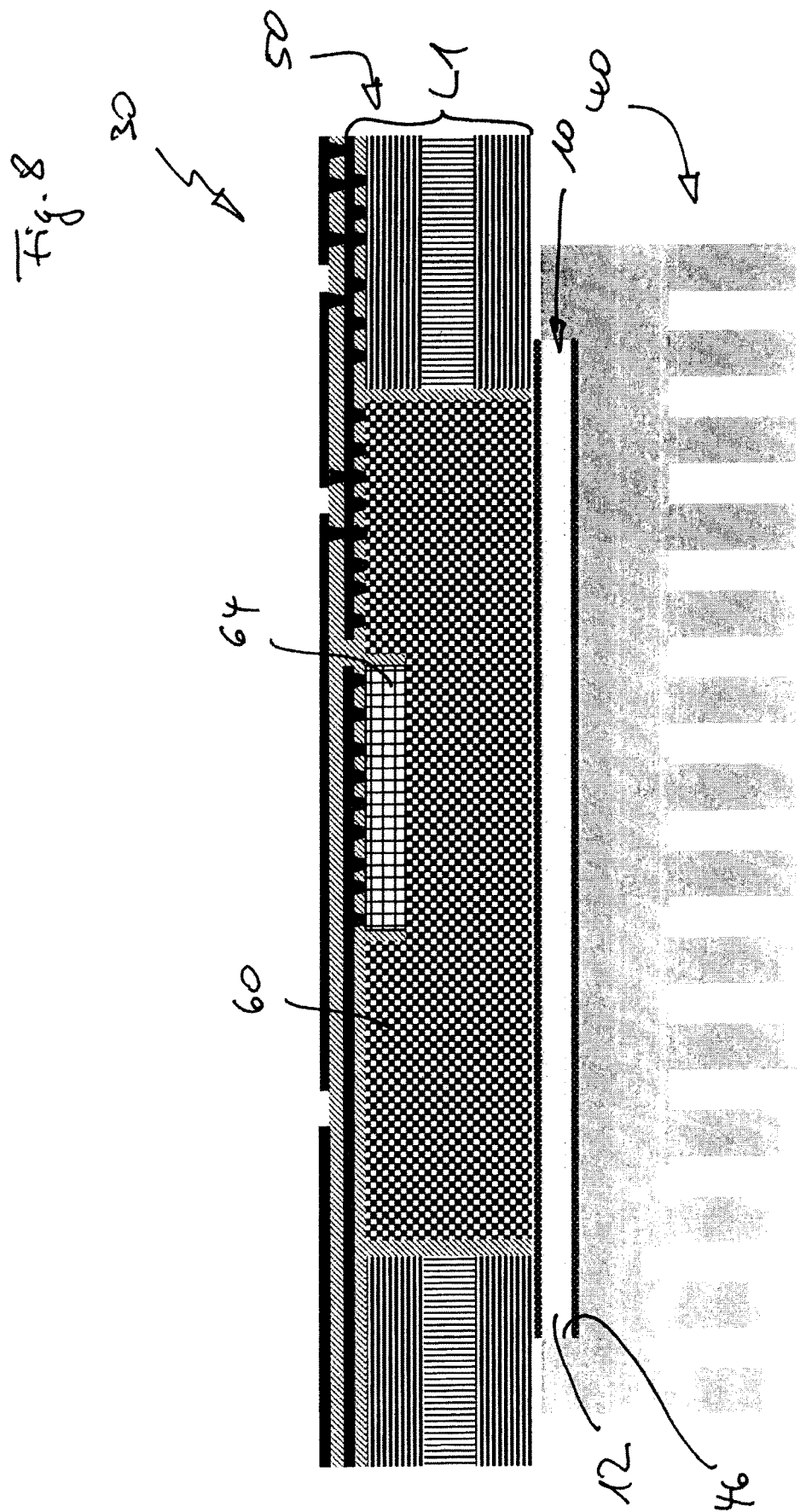

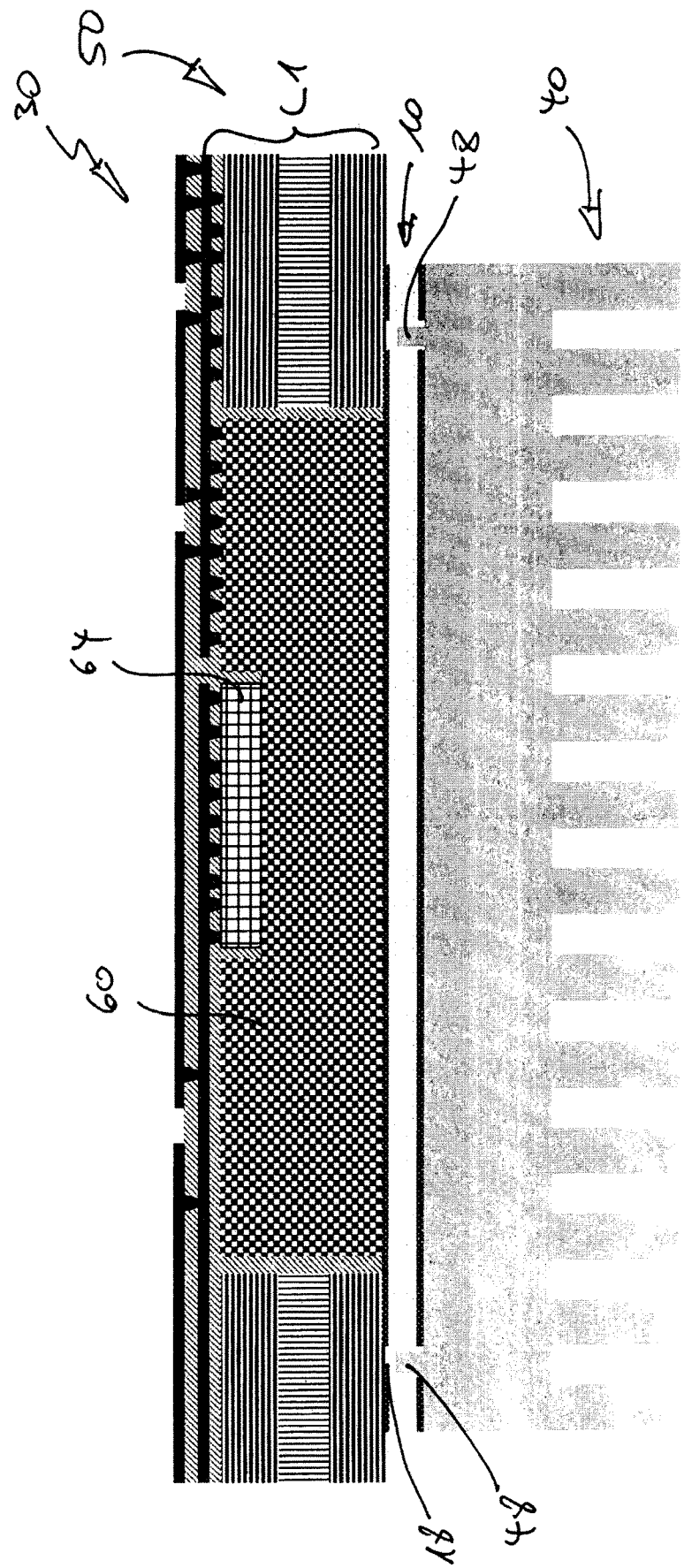

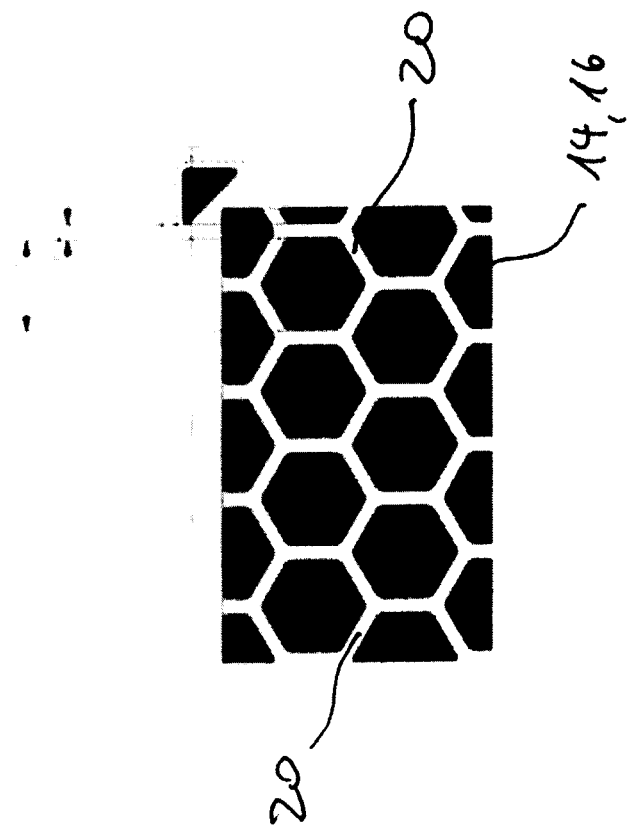

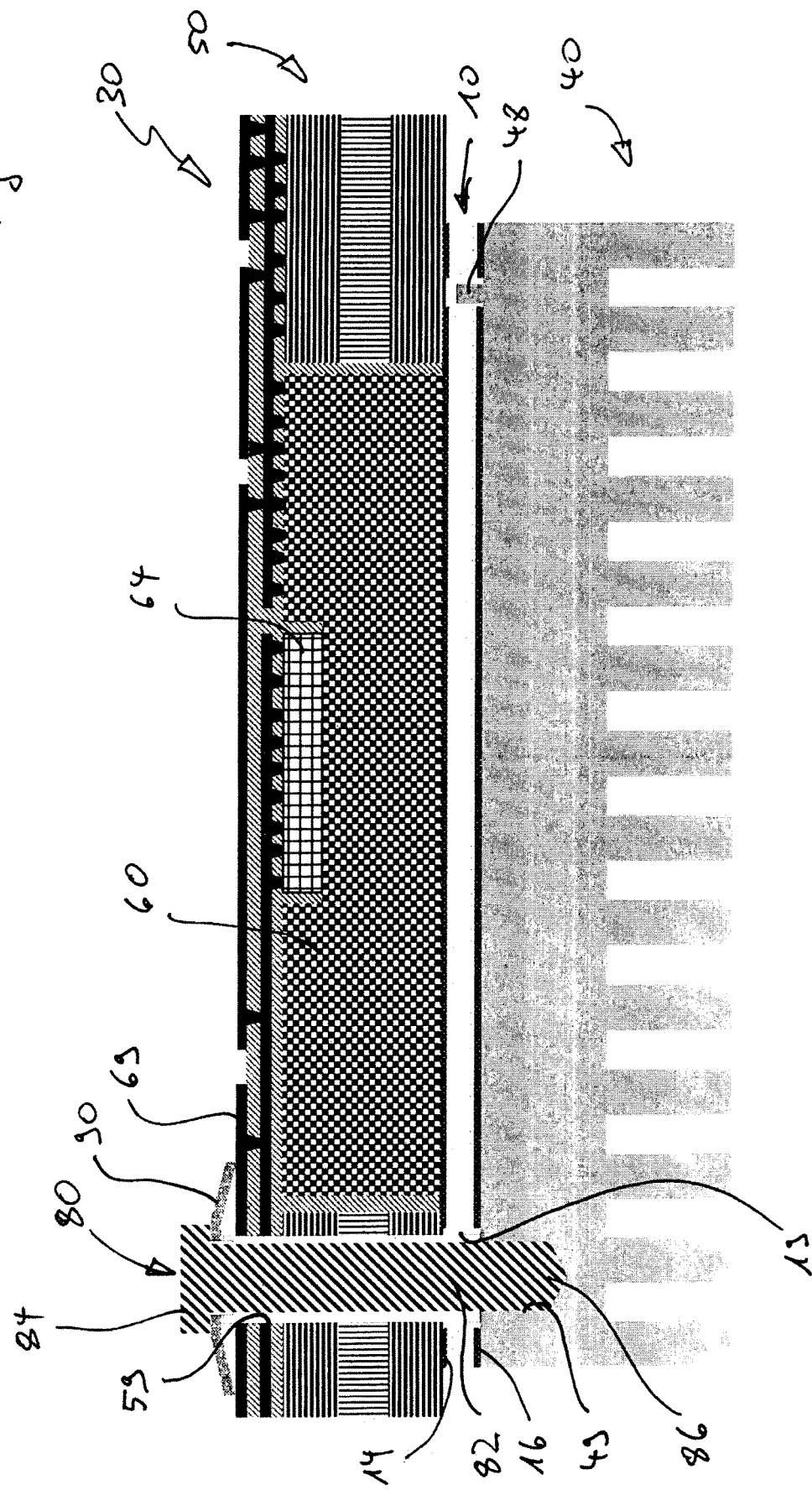

PRINTED CIRCUIT BOARD MODULE, PRINTED CIRCUIT BOARD ELEMENT, HEATSINK, HEAT-CONDUCTING ELEMENT AND METHOD OF PRODUCING A THERMALLY CONDUCTIVE LAYER

TECHNICAL FIELD

The present invention relates to a printed circuit board module having a printed circuit board and a heatsink, to a printed circuit board element, to a heatsink, to a heat-conducting element and to a method of producing a thermally conductive layer between a printed circuit board or printed circuit board element and a heatsink.

DESCRIPTION OF THE PRIOR ART

Printed circuit board elements are increasingly being produced for use in high-current applications. Since these are regularly associated with very significant generation of heat, controlled efficient removal of heat constitutes a major challenge. Typically, the printed circuit board or printed circuit board elements are connected to a heatsink for removal of heat. The connecting surface is formed, for example, from copper. The heat from the components in the printed circuit board element is removed rapidly, for example via a copper foil, into a thick metal carrier connected to the heatsink mass. An electrically insulating layer generally has to be provided therebetween.

Additionally known from the prior art are phase change materials (PCM; also called latent heat materials), which, as interface material, combine low heat resistance with high surface wettability. Phase change materials are wax-like thermal compounds that change phase at a specifically formulated temperature. For example, the phase change material is in the solid phase at room temperature and changes to the liquid phase over and above a temperature of about 50-60° C. Typically, phase change materials are silicone-free paraffin-based wax materials (which is why they are also called heat-conducting waxes), but they may also be acrylic-based.

SUMMARY OF THE INVENTION

Based on this, the invention proposes a printed circuit board module, a printed circuit board, a heatsink, and a heat-conducting element.

T The idea according to the invention is to provide a ceramic support coated with a phase change material as an intermediate layer with high thermal conductivity and electrically insulating behavior for efficient heat dissipation. The ceramic carrier may be coated on one or both sides. Ceramic as carrier or substrate material has the great advantage of being electrically insulating compared to coated metal foils. This makes it possible to make the printed circuit board non-insulating and to transfer the property of electrical insulation to the heat sink to the layer between the printed circuit board and the heat sink. One suitable material is silicon nitride ($Si_3N_4$), which has a high fracture strength and can be provided in thin layers for coating with phase change material and additionally has a low coefficient of thermal expansion. Other ceramics, for example aluminium nitride (AlN), which also have high thermal conductivity, may likewise be used. It may be further advantageous to provide the ceramic with metallization having good thermal properties on one or both sides, e.g. copper (Cu), in order to minimize the tendency to fracture during mechanical processes.

The thermal conductivity of the phase change material may be increased further by enriching it with fillers such as ceramic ($Al_2O_3$, $ZrO_2$, $Si_3N_4$, AlN, . . . ), boron nitride, graphite, metal or other thermally conductive fillers, which may be electrically conductive or nonconductive.

In addition, it is possible to fix the relative position between printed circuit board and heatsink by means of a suitable fixing element, for example one or more screws, which may particularly have a resilient or flexible washer or be spring-mounted.

Further advantages and configurations of the invention are apparent from the claims, the description and the appended drawing.

It will be apparent that the features specified above and those still to be elucidated hereinafter are usable not just in the particular combination specified but also in other combinations or on their own without leaving the scope of the present invention.

The invention is represented schematically by a working example in the drawing, and is described in detail hereinafter by reference to the drawing.

BRIEF DESCRIPTION OF THE DRAWING

FIG. 7 shows the printed circuit board and the heat-conducting element of FIG. 5 with heatsink mounted thereon.

FIG. 8 shows a lateral section view of a printed circuit board module of the invention, in which the heat-conducting element is fitted into a depression formed in the heatsink.

FIG. 9, similarly to FIG. 8, shows a configuration of the invention in which the heat-conducting element is fitted onto pins or projections formed on the heatsink.

FIG. 10 shows a detail of a top view of a phase change material coating of a heat-conducting element according to the invention with air channels formed therein.

FIG. 11, shows, similarly to FIG. 9, a configuration of the invention with mechanical fixing of printed circuit board and heatsink by means of screw connection.

DETAILED DESCRIPTION

Figure 1:
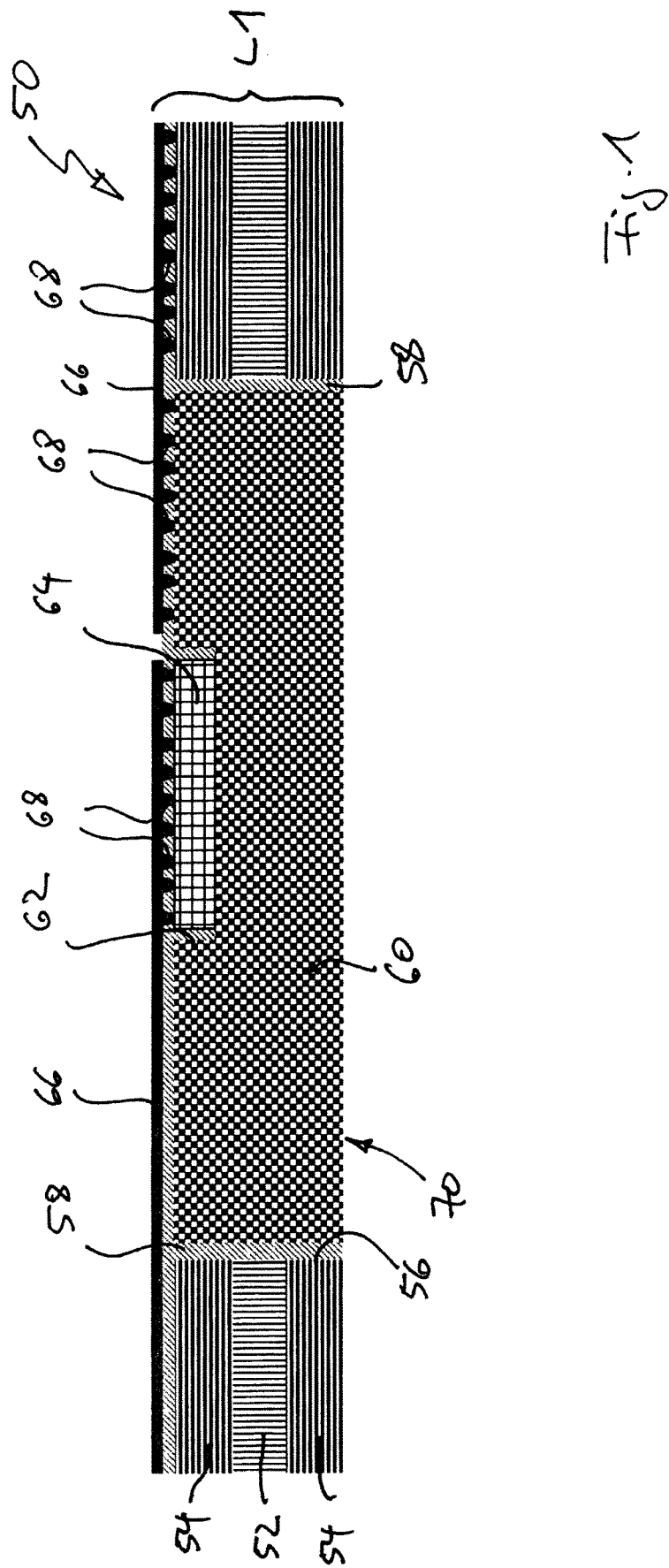
FIG. 1 shows a lateral section view of a printed circuit board for use with the invention.

Identical and similar features shown in the individual figures are given the same reference numerals.

Figure 2:
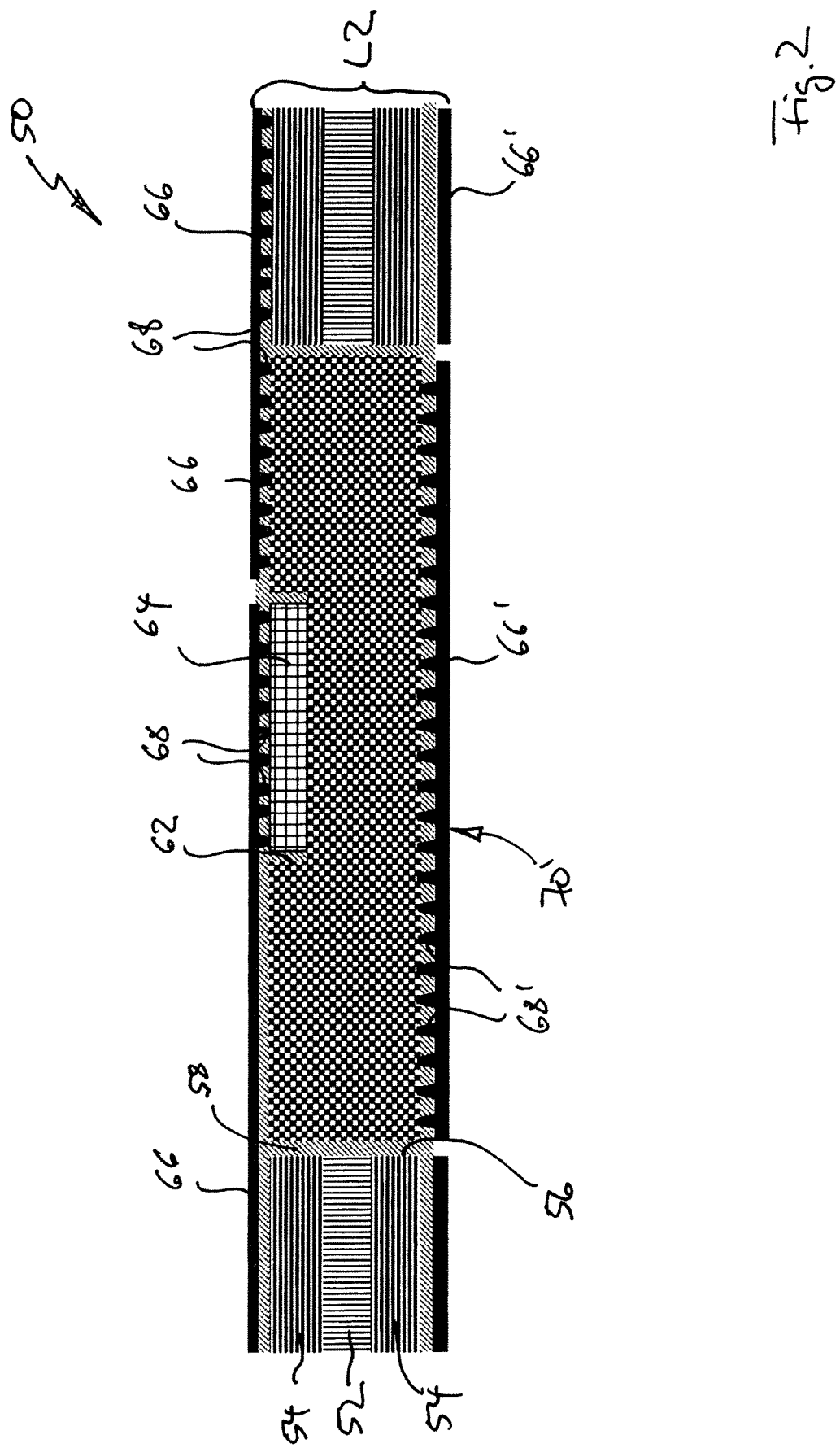
FIG. 2 shows a lateral section view of an alternative printed circuit board for use with the invention.

FIG. 1 shows a lateral section view of a printed circuit board 50 with a printed circuit board layer construction L1 known per se, and FIG. 2 shows an alternative printed circuit board 50 with a printed circuit board layer construction L2. The printed circuit boards of FIGS. 1 and 2 show examples of possible layer constructions as usable in connection with the present invention. However, the invention is additionally applicable to all possible designs and configurations of printed circuit boards.

The term "printed circuit board" should be understood broadly in connection with the present invention and also includes printed circuit board elements that may be formed, for example, with or without electronic components, with or without embedded elements such as leadframes, and with thick-layer and/or thin-layer conductor tracks. More particularly, on account of the efficient removal of heat, the invention is suitable for use of printed circuit boards with high-current applications. Possible printed circuit board constructions are described, for example, in EP 2 524 394 B1 or EP 2 973 687 B1.

The printed circuit board structure L1 of the printed circuit board 50 of FIG. 1 comprises, by way of example, as shown, a nonconductive core layer 52 with copper layers 54 applied to either side. Embedded in a recess 56 is a leadframe 60 with an electronic component (chip) 64 disposed in a depression 62 formed therein. Gaps and interspaces are filled in a manner known per se by prepreg material 58 that has been liquefied during the lamination process and subsequently resolidified. On a top side of the layer construction L1 is provided a printed circuit board layer 66, the conductor tracks of which are contacted by means of vias (μ-vias) 68 in a manner known per se.

The printed circuit board layer structure L2 shown in FIG. 2 differs from the structure shown in FIG. 1 in that the leadframe 60 is (symmetrically) enclosed by lamination on both sides, i.e. a metal layer 66' is likewise provided on the underside of the layer structure. As shown, it may be a printed circuit board layer 66' to which an underside of the leadframe 60 is contacted by means of vias 68'. Alternatively, it may also be a full-surface metal layer, particularly Cu layer.

In both printed circuit board layer structures L1, L2, the underside is designed as a surface 70/70' for binding to a heatsink.

Figure 3:
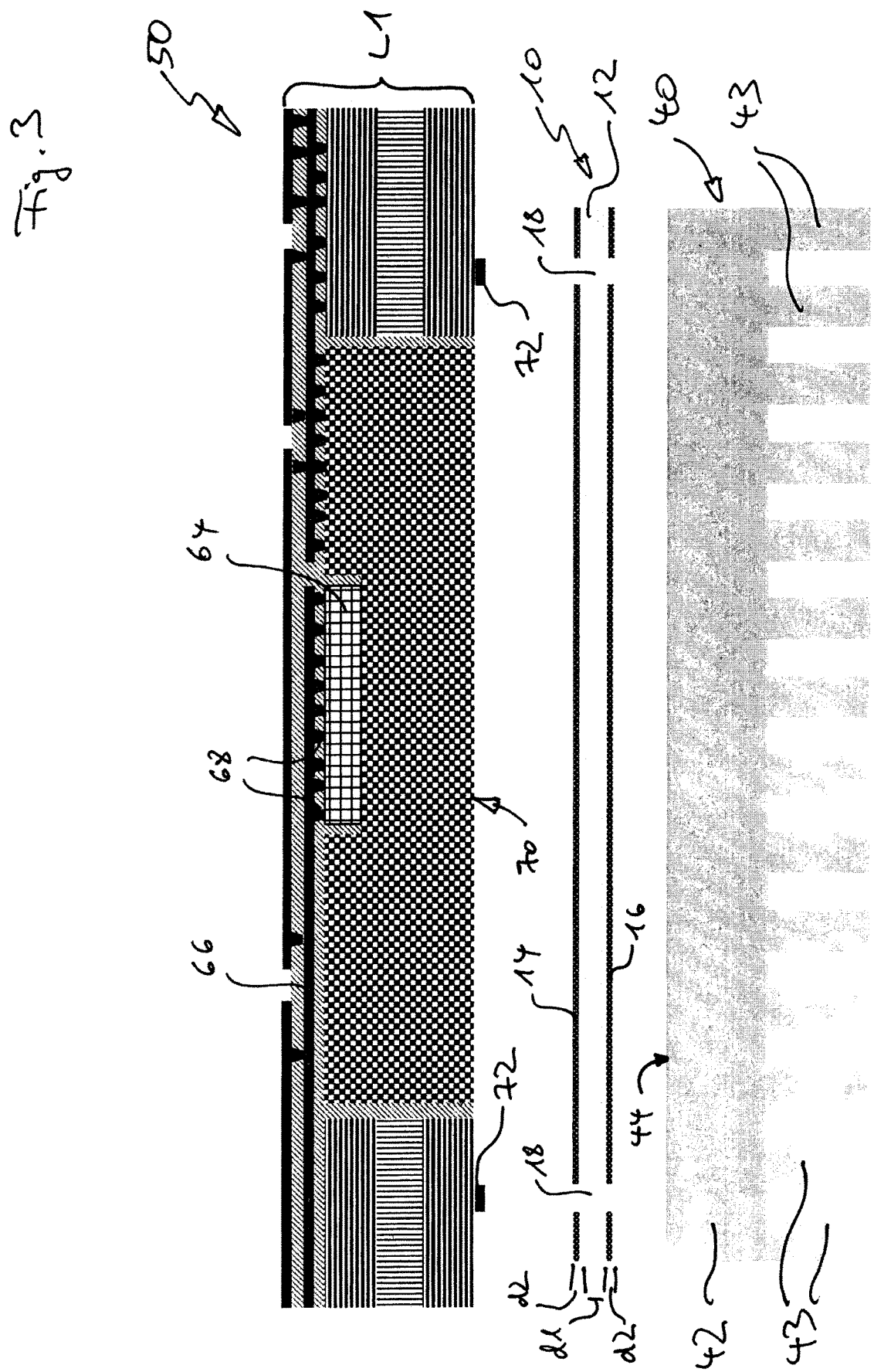
FIG. 3 shows a lateral section view of a printed circuit board, a heat-conducting element and a heatsink prior to assembly to give a printed circuit board module of the invention, wherein pins or projections are provided on the printed circuit board for mounting of the heat-conducting element.

Such a heatsink 40 is shown by way of example in highly schematic form in FIG. 3. The heatsink 40 of FIG. 3 preferably consists of highly thermally conductive material, for example of metal, such as copper or aluminium or the like, and may, for example, as shown, have a main body 42 on which cooling fins 43, for example, may be formed. On a top face, the heatsink 40 has a surface 44 provided for binding to a printed circuit board or printed circuit board element. Other forms of heatsinks are likewise possible, for example those without cooling fins.

The surface 44 of the heatsink 40 provided for attachment to a printed circuit board and the surface 70/70' of the printed circuit board 50 provided for attachment to a heatsink are essentially planar and configured with low roughness in order to achieve maximum heat transfer.

What is now envisaged by the invention is provision, between the surface 44 of the heatsink 40 and the surface 70, 70' of the printed circuit board 50, of a heat-conducting element 10 comprising a ceramic carrier 12 preferably coated on both sides (i.e. on each of the surfaces 40, 70, 70') with a phase change material 14, 16 (cf. FIG. 3).

Phase change materials as interface material combine a low heat resistance with high surface wettability. On account of the waxy consistency of the phase change material 14, 16, the surface of the heat-conducting element 10 according to the invention exactly conforms to the connecting surfaces 44, 70, 70'. On exceedance of the phase change temperature, the phase change material is liquefied and assures good wetting of the contact surfaces (here the connecting surfaces 44, 70, 70' of heatsink and printed circuit board). The inventive application of the phase change material to a ceramic carrier firstly combines high thermal conductivity with electrical insulation capacity. Secondly, the use of ceramic material for the carrier of the heat-conducting element, on account of high compressive strength compared to other possible materials, permits a very thin configuration of the heat-conducting element with high thermal conductivity.

Typically, the inventive heat-conducting element 10 may have a thickness d1 for the ceramic carrier 12 within a range between around 80 μm and around 120 μm, for example in the order of magnitude of about 100 μm. For higher mechanical strength, greater thicknesses, for example 320 μm, may also be provided. Some ceramic materials are available only from greater thicknesses, for example AlN (630 μm). In this case, the thickness of the insulation increases, while the other thicknesses remain essentially the same.

A thickness d2 of the coating with phase change material may, for example, be within a range from around 10 μm to around 100 μm, for example between about 25 μm and about 50 μm. This leads to a typical total thickness of the ceramic carrier (d1+2*d2) in an order of magnitude of about 100 μm to about 320 μm, preferably between 150 μm and 200 μm. If the ceramic carrier is additionally coated with metal, for example Cu, the thickness increases in accordance with the thickness of metal layer(s) applied. In this case, the phase change material is present on the surface of the metal/copper.

An example of a useful material for the ceramic carrier 12 is silicon nitride, but other ceramic materials familiar to the person skilled in the art and having sufficiently high fracture resistance for formation of a thin ceramic carrier layer in two-dimensional form are also possible.

The phase change material may additionally be enriched with a filler which has good thermal conductivity and may be selected, for example, from the group comprising ceramic ($Al_2O_3$, $ZrO_2$, $Si_3N_4$, AlN), boron nitride, graphite and/or metal. The filler size is much less than the layer thickness d2 and may typically be 1/10 or less of the layer thickness. The melting temperature (phase change temperature) of the phase change material should typically be within a range from about 50° C. to about 60° C., but may also be lower or higher.

In the production of an inventive printed circuit board module having a printed circuit board 50 and a heatsink 40 and the two-dimensional heat-conducting element 10 provided between the two, the printed circuit board and the heatsink are provided, and the heat-conducting element is introduced between the printed circuit board and the heatsink in such a way that it comes to rest on the respective surfaces of the printed circuit board and of the heatsink provided for attachment.

In order to facilitate the bonding operation, the heat-conducting element may, in accordance with the invention, be mounted beforehand on the surface 70, 70' of the printed circuit board 50 intended for binding or on the surface 44 of the heatsink 40 intended for binding. This can be effected, for example, by means of a suitable adhesion-promoting material. In order, however, to avoid introducing a further material with possibly different thermal conductivity again and/or properties that are not in harmony with the liquid phase of the phase change material, there may be mechanical fixing of the heat-conducting element 10 on the connecting surface 70, 70' of the printed circuit board 50 or on the connecting surface 44 of the heatsink 40.

The diagram of FIG. 3 shows, as one possible variant for the mechanical mounting of the heat-conducting element, one, two or more pin-like projections 72 formed on the connecting surface 70 of the printed circuit board 50. The projections 72 are intended to mesh accurately into holes 18 correspondingly provided for the purpose in the heat-conducting element 10. For instance, the heat-conducting element 10 may be mounted on the connecting surface 70 of the printed circuit board 50 in that it is mounted onto the projections 72 by the holes 18 (cf. sequence of figures: FIG. 3=>FIG. 5).

Figure 4:
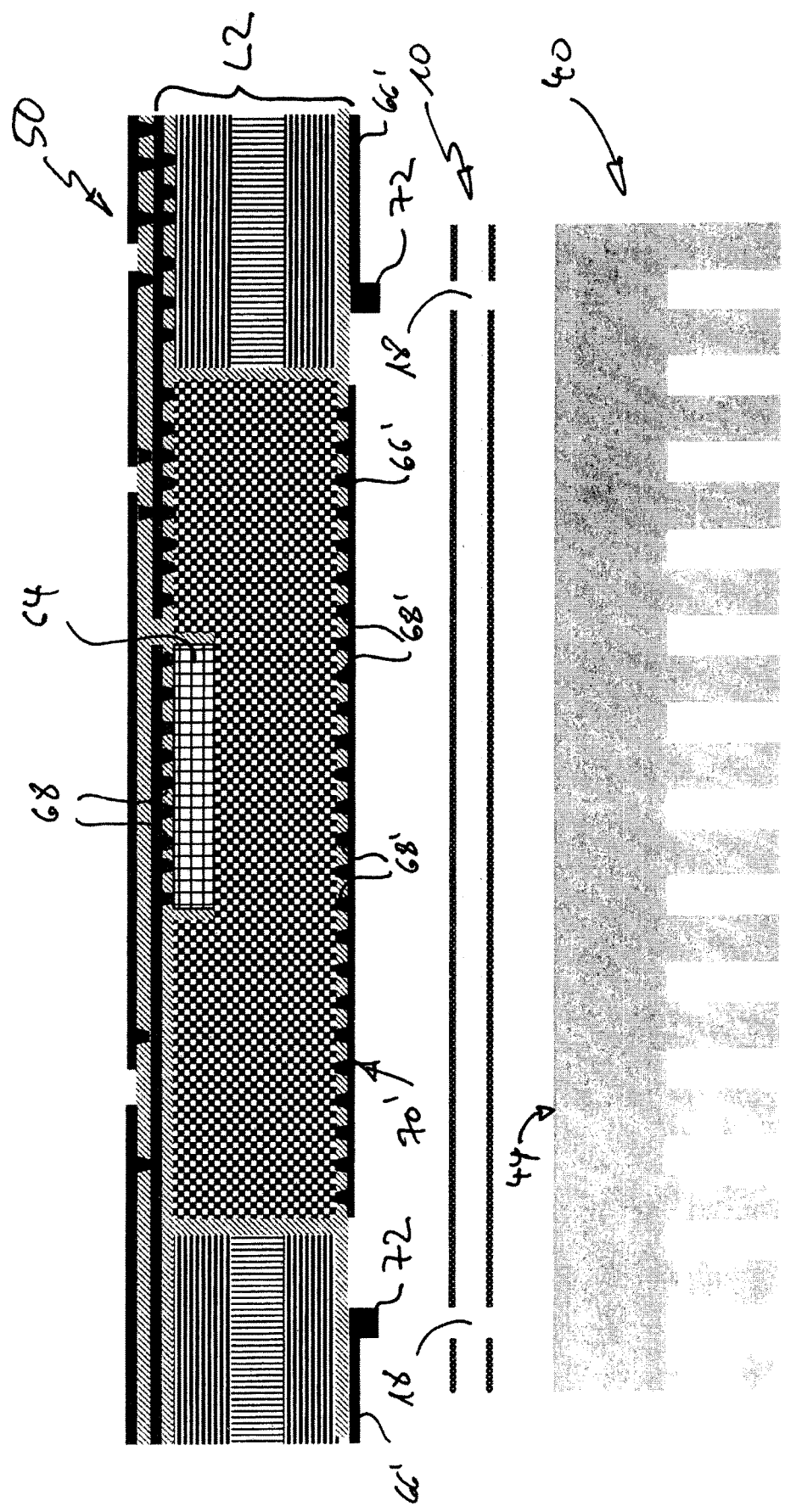
FIG. 4 shows the diagram from FIG. 3 with an alternative printed circuit board.

Such projections (or else bumps) 72 can also be formed in an analogous manner on the connecting surface 70' of the variant of the printed circuit board 50 shown in FIG. 2 with an additional printed circuit board layer 66', as illustrated in the diagram in FIG. 4.

The projections 72 may be formed, for example, from metal (such as copper). The mounting and configuration of the projections 72 on the connecting surface 70 can be effected, for example, by galvanizing application or another method familiar to the person skilled in the art.

Figure 6:
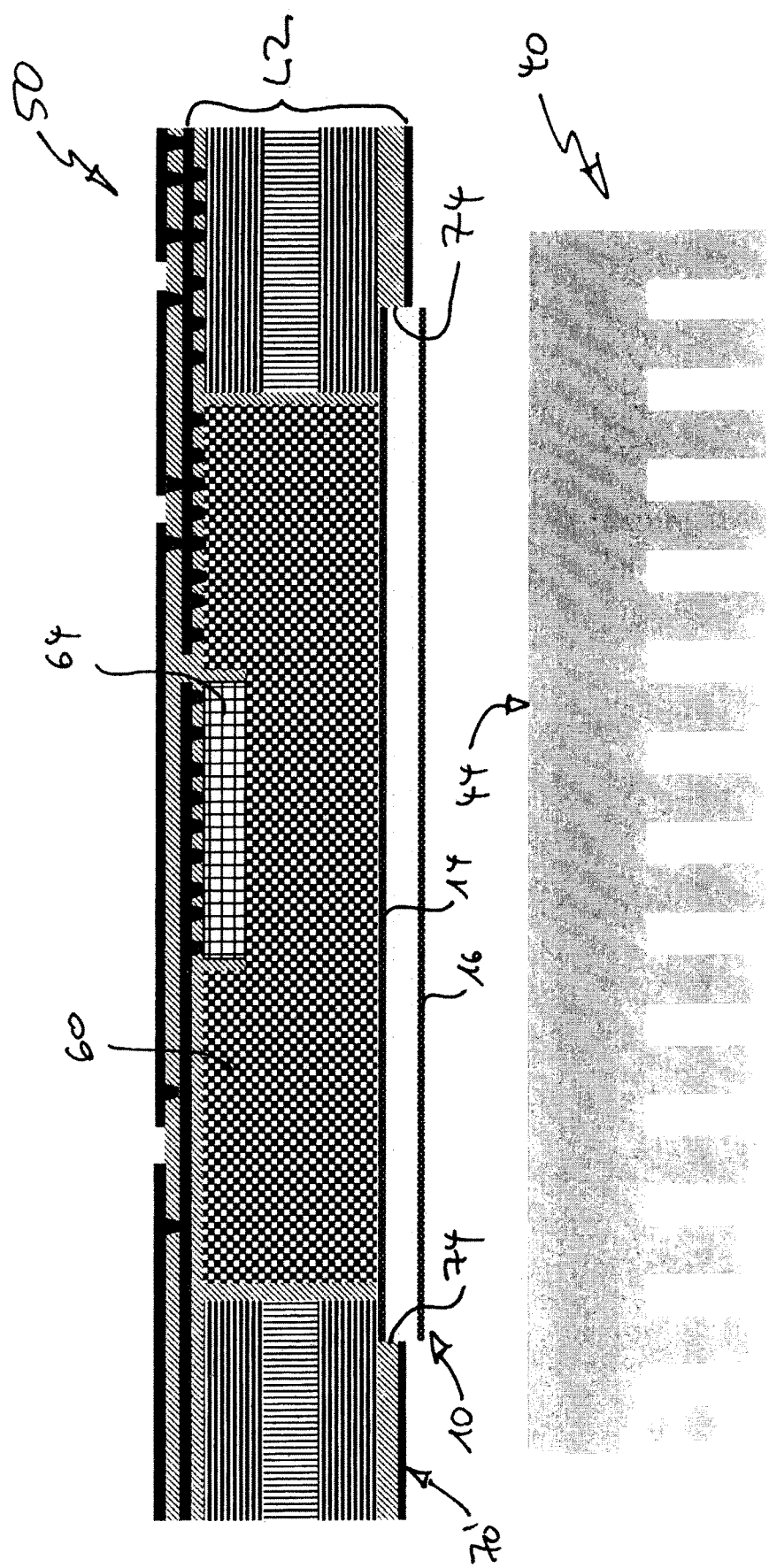
FIG. 6 shows a lateral section view of an alternative configuration of a printed circuit board with heat-conducting element mounted thereon, wherein the heat-conducting element is fitted into a depression in the printed circuit board.

As an alternative to the projections 72 described, the heat-conducting element 10 may also be connected to the printed circuit board 50 by insertion/fitting into an accurately fitting depression 74 formed for the purpose in the connecting surface 70, 70' of the printed circuit board 50, as illustrated schematically in FIG. 6. Configuration of such a depression 74 in the alternative printed circuit board 50 of FIG. 2 is of course likewise possible, even if not shown explicitly in the image.

Figure 5:
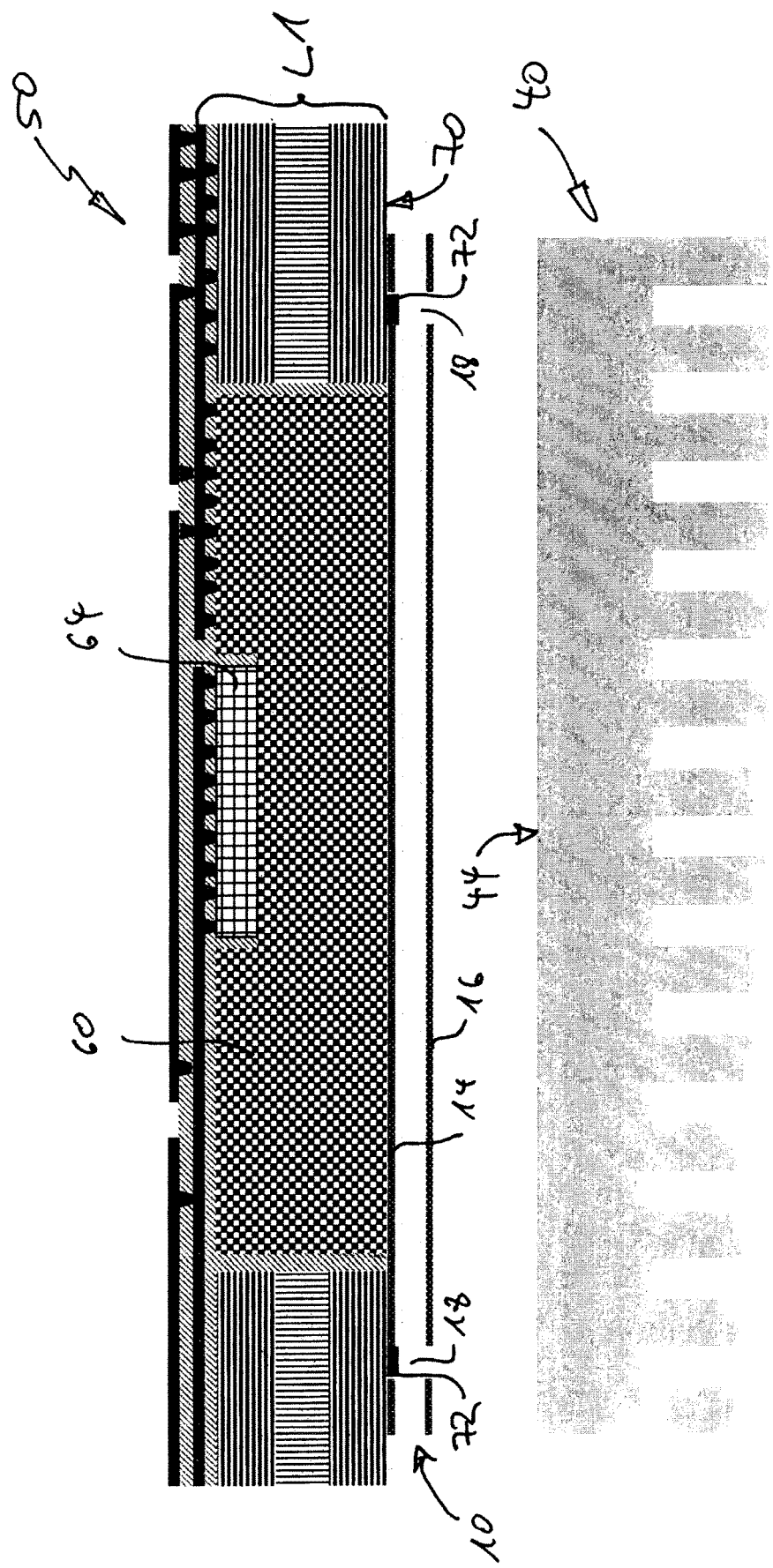
FIG. 5 shows the printed circuit board and the heat-conducting element of FIG. 3 in the assembled state.

FIG. 7 shows the arrangement of printed circuit board and heat-conducting element with associated heatsink 40 described in association with FIG. 5. The heatsink 40 adjoins a phase change coating of the heat-conducting element 10 by its surface 44 provided for attachment.

FIGS. 8 and 9 each show a further working example of a printed circuit board module of the invention. In these two working examples, the heat-conducting element is not, as described above, mounted on the printed circuit board beforehand, but rather on the heatsink.

In the working example of FIG. 8, the heatsink 40, for this purpose, has a depression 46 in the form of a surface 44 provided on its surface intended for attachment, designed for accurately fitting accommodation of the heat-conducting element 10. Here, as is also the case for the depression 74 in the printed circuit board 50, it should be ensured that a depth of the depression 46/74 is less than a total thickness of the heat-conducting element tend to be inserted.

In the working example of FIG. 9, pin-like projections 48 are formed analogously to the projections 72 of the printed circuit board described above in connection with FIGS. 3 to 5 and 7 on the surface 44 of the heatsink 40 intended for attachment. The heat-conducting element 10 is correspondingly mounted onto the projections 48 by its holes 18 before connection to the printed circuit board 50.

For fixing of a relative layer of the printed circuit board 50 to the heatsink 40, the printed circuit board and the heatsink may be fixed mechanically to one another (particularly in a sprung manner) with the heat-conducting element therebetween.

This mechanical fixing can be effected, for example, by means of a screw connection, as illustrated by FIG. 11. For example, the printed circuit board 50 and the heatsink 40 may be screw-connected to one another by means of a screw 80 that extends vertically with respect to the planes of extension of the printed circuit board 50 and of the heatsink 40.

For this purpose, the printed circuit board 50 has a through-bore 59, through which the screw 80 having a screw body 82 is guided. At one end of the screw body 82 is formed a screw head 84. The screw body 82 extends through the through-bore 59 (and a bore 19 provided correspondingly in the heat-conducting element 10) and meshes by an opposite end of the screw 86 from the screw head 84 into a receiving bore 49 provided with a thread that has been formed in the heatsink 40. For compensation of changes in volume and hence thickness in a phase transition of the phase change material 14, 16, the screw 80 may have a resilient washer element 90, for example a spring washer or (as shown) a cup spring which may rest, for example, as shown on an outer layer 69 of the printed circuit board 50.

Other configurations of the mounting of the screw connection are of course possible. For example, the heatsink 40 may be provided with a through-bore, at the distal end of which (screw exit) there is a screw connection to a nut. Conversely, the screw 80 can also be introduced from the heatsink side.

The diagram of FIG. 11 shows, by way of example and in schematic form, the arrangement with a screw 80. It will be immediately apparent to the person skilled in the art that, according to size and geometry of the printed circuit board module, fixing by means of two or more screws is possible.

Further options for mechanical fixing include, for example, one or more clamps that embrace the printed circuit board module, or the use of snap elements that engage behind their counterparts and act between printed circuit board and heatsink.

In order to enable very good and uniform connection without trapped air (which can lead to thermal gaps), the ceramic carrier can be coated with the phase change material in such a way that at least one air channel is formed in the phase change material before the first phase change. The air channel is designed such that it enables escape of any trapped air that arises in the interspace between attachment surface 44, 70, 70' (of the heatsink or printed circuit board) and the phase change material in the event of a change of phase, transverse to the plane of extension (in the plane of the drawing in the diagram in FIG. 10).

As apparent by way of example from the working example of FIG. 10, which shows a phase change material layer in top view, this air channel may be formed, for example, by a gap 20 introduced into the layer of phase change material in honeycomb structure. The gap width may, for example, be in the order of magnitude of 0.5 mm in the case of a honeycomb diameter of, for example, 3 mm, it being within the scope of competence of the person skilled in the art to fix a suitable gap width. Other structures composed of one or more gaps or air channels are within the scope of ability, for example circle structures, diamonds, chessboard patterns or the like.

A first heating operation on the heat-conducting element (10) at least up to a phase change temperature of the phase change material 14, 16 can be effected, for example, by a first operation of the printed circuit board (50) or of the printed circuit board module 30 or else specifically by external heating, in order to achieve wetting of the surfaces 44, 70, 70' intended for binding with the liquid phase change material 14, 16.

The following is a list of numbered aspects of the present invention:

1. Heat-conducting element (10) having a ceramic carrier (12) coated with a phase change material (14, 16).

2. Heat-conducting element (10) according to Aspect 1, the ceramic carrier (12) of which takes the form of a two-dimensional ceramic platelet, for example having a thickness (d1) between 80 μm and 700 μm, preferably between 80 μm and 320 μm, further preferably between 80 μm and 120 μm, and/or the ceramic carrier (12) of which has preferably been coated on both sides with the phase change material (14, 16), for example in a thickness (d2) between 10 μm and 100 μm, particularly a thickness (d2) between 25 μm and 50 μm, and/or wherein a metal coating has been provided between the ceramic carrier (12) and the phase change material (14, 16), for example in a thickness between 30 and 500 μm, particularly between 100 μm and 300 μm.

3. Heat-conducting element (10) according to Aspect 1 or 2, in which the coating with phase change material (14, 16) has at least one air channel (20) that promotes escape of air during the phase transition, and/or
in which at least one hole (18) designed for mounting of the heat-conducting element (10) onto at least one pin-like projection (48, 72) on a surface (44, 70, 70') intended for binding is provided, and/or
in which at least one bore (19) designed for penetration by a fixing element (80) is provided.

4. Heat-conducting element (10) according to any of Aspects 1 to 3, the ceramic carrier (12) of which contains silicon nitride or aluminium nitride and/or a phase change material (14, 16) of which has been enriched with a filler selected from the group comprising ceramic ($Al_2O_3$, $ZrO_2$, $Si_3N_4$, AlN), boron nitride, graphite and/or metal.

5. Printed circuit board module (30) having a printed circuit board (50) and a heatsink (40) and, provided between printed circuit board (50) and the heatsink (40), a two-dimensional heat-conducting element (10) comprising a ceramic carrier (12) coated with a phase change material (14, 16), particularly according to any of Aspects 1 to 4.

6. Printed circuit board module (30) according to Aspect 5, in which the heat-conducting element (10) is mounted on the printed circuit board (50) or on the heatsink (40), for example by a mechanical fixing, or alternatively for example by fitting into a depression (74) provided for the purpose in the printed circuit board (50) or the heatsink (40) or by fitting onto pin-like projections (72, 48) designed for the purpose on the printed circuit board (50) or the heatsink (40).

7. Printed circuit board module (30) according to Aspect 5 or 6, in which the relative position of printed circuit board (50) and heatsink (40) is fixed by means of at least one fixing element (80), wherein the mechanical fixing is particularly sprung.

8. Printed circuit board module (30) according to Aspect 7, in which the printed circuit board (50) and the heatsink (40) are screwed to one another.

9. Printed circuit board module (30) according to any of Aspects 5 to 8, in which, in the printed circuit board (50) or the heatsink (40), a through-bore (59) is provided to accommodate a screw (80) and one end of the screw (86) meshes into a receiving bore (49) which preferably has a mating thread and is formed in the heatsink (40) or the printed circuit board (50), wherein a screw head (84) of the screw (80) particularly has a sprung washer element (90).

10. Printed circuit board (50) having a printed circuit board layer structure (L1, L2) with a two-dimensional heat-conducting element (10) comprising a ceramic carrier (12) coated with a phase change material (14, 16) provided on a surface (70, 70') intended for connection to a heatsink (40), particularly according to any of Aspects 1 to 4.

11. Printed circuit board (50) according to Aspect 10, which, for attachment of the heat-conducting element (10), comprises a depression (74) intended for fitting of the heat-conducting element (10) or pin-like projections (72) designed for mounting of the heat-conducting element (10).

12. Heatsink (40) with a two-dimensional heat-conducting element (10) comprising a ceramic carrier (12) coated with a phase change material (14, 16) provided thereon for binding to a printed circuit board (50), particularly according to any of Aspects 1 to 4.

13. Heatsink (40) according to Aspect 12, which, for attachment of the heat-conducting element (10), comprises a depression (46) intended for fitting of the heat-conducting element (10) or pin-like projections (48) designed for mounting of the heat-conducting element (10).

14. Method of producing a thermally conductive layer between a printed circuit board (50) and a heatsink (40), comprising the following steps:
providing a printed circuit board (50) with a surface (70, 70') intended for attachment to a heatsink (40), particularly according to Aspect 10 or 11,
providing a heatsink (40) having a surface (44) intended for attachment to a printed circuit board (50), particularly according to Aspect 12 or 13,
mounting a heat-conducting element (10) either on the surface (70, 70') of the printed circuit board (50) intended for binding or on the surface (44) of the heatsink (40) intended for binding, wherein the heat-conducting element (10) comprises a ceramic carrier (12) coated with a phase change material (14, 16), particularly according to any of Aspects 1 to 4,
heating the heat-conducting element (10), for example by operating the printed circuit board (50) or by external heating, at least up to a phase change temperature of the phase change material (14, 16), in order to achieve wetting of the surfaces (44, 70, 70') intended for binding with the liquid phase change material (14, 16).

15. Method according to Aspect 14, having the further step of mechanical fixing, particularly of screw-connecting the printed circuit board (50) and heatsink (40), for example by introducing a screw (80) into a through-bore (59) provided for the purpose in the printed circuit board (50) or the heatsink (40) and tightening the screw, preferably after inserting a sprung washer element (90).

The invention claimed is:

1. Printed circuit board, comprising:
a printed circuit board layer structure including projections; and
a two-dimensional heat-conducting element comprising a ceramic carrier coated with a phase change material, the heat-conducting element including holes into which the projections are fitted.

2. Printed circuit board module, comprising:
a printed circuit board;
a heatsink; and
a two-dimensional heat-conducting element comprising a ceramic carrier coated with a phase change material, the two-dimensional heat-conducting element being provided between the printed circuit board and the heatsink, the two-dimensional heat-conducting element including a hole, and the printed circuit board or the heatsink including a projection fitted into the hole.

3. Printed circuit board module, comprising:
a printed circuit board;
a heatsink;

a two-dimensional heat-conducting element comprising a ceramic carrier coated with a phase change material, the two-dimensional heat-conducting element being provided between the printed circuit board and the heatsink; and the printed circuit board, the two-dimensional heat-conducting element and the heatsink are penetrated by a screw that hold the printed circuit board, the two-dimensional heat-conducting element and the heatsink together.

* * * * *